(12) United States Patent
Stange

(10) Patent No.: US 11,499,688 B2
(45) Date of Patent: Nov. 15, 2022

(54) LIGHT DEVICE, HEADLIGHT AND METHOD

(71) Applicant: OSRAM GmbH, Munich (DE)

(72) Inventor: Markus Stange, Berlin (DE)

(73) Assignee: OSRAM GMBH, Munich (DE)

( * ) Notice: Subject to any disclaimer, the term of this patent is extended or adjusted under 35 U.S.C. 154(b) by 318 days.

(21) Appl. No.: 16/618,170

(22) PCT Filed: May 11, 2018

(86) PCT No.: PCT/EP2018/062234
§ 371 (c)(1),
(2) Date: Nov. 29, 2019

(87) PCT Pub. No.: WO2018/219622
PCT Pub. Date: Dec. 6, 2018

(65) Prior Publication Data
US 2021/0140599 A1 May 13, 2021

(30) Foreign Application Priority Data

May 30, 2017 (DE) ...................... 10 2017 209 065.0

(51) Int. Cl.
*F21S 41/19* (2018.01)
*F21S 41/141* (2018.01)
(Continued)

(52) U.S. Cl.
CPC .............. *F21S 41/192* (2018.01); *F21K 9/90* (2013.01); *F21S 41/141* (2018.01); *H05K 1/111* (2013.01);
(Continued)

(58) Field of Classification Search
CPC ......... F21S 41/192; F21S 41/141; F21K 9/90; H05K 1/111; H05K 1/181;
(Continued)

(56) References Cited

U.S. PATENT DOCUMENTS

| | | | |
|---|---|---|---|
| 2005/0082686 A1* | 4/2005 | Liu ...................... | H05K 3/3442 257/780 |
| 2007/0238328 A1 | 10/2007 | Ferstl | |
| 2008/0012035 A1* | 1/2008 | Wang ................... | G02B 6/0073 257/E25.02 |
| 2014/0217456 A1 | 8/2014 | Ahn et al. | |

(Continued)

FOREIGN PATENT DOCUMENTS

| | | |
|---|---|---|
| DE | 102005017527 A1 | 11/2006 |
| DE | 102014005298 A1 | 9/2014 |

(Continued)

OTHER PUBLICATIONS

International Search Report based on Application No. PCT/EP2018/062234 (16 pages) dated Aug. 30, 2018 (for reference purpose only).

(Continued)

*Primary Examiner* — Sitaramarao S Yechuri
(74) *Attorney, Agent, or Firm* — Viering Jentschura & Partner MBB

(57) ABSTRACT

A light device may include a printed circuit board having at least one conductive section. An LED may be electrically connected and fixed on a conductive section of the printed circuit board by means of a soldered connection. The printed circuit board may also include a coating-type insulating layer and/or the conductive section has an edge. The fixing region of the LED is connected to a discharge space by means of an outlet, so that during the production process, melted solder can flow off in a defined manner. The arrangement and/or embodiment of the outlet is such that in a preferred direction of movement of the LED is developed in order to position same in a defined manner.

20 Claims, 2 Drawing Sheets

(51) Int. Cl.
*F21K 9/90* (2016.01)
*H05K 1/11* (2006.01)
*H05K 1/18* (2006.01)
*H05K 3/34* (2006.01)
*F21Y 115/10* (2016.01)

(52) U.S. Cl.
CPC ........... *H05K 1/181* (2013.01); *H05K 3/3431* (2013.01); *F21Y 2115/10* (2016.08); *H05K 2201/09381* (2013.01); *H05K 2201/10106* (2013.01); *H05K 2203/048* (2013.01)

(58) Field of Classification Search
CPC .......... H05K 2201/09381; H05K 2201/10106; H05K 2203/048; H05K 2203/046; H05K 3/3431; H05K 3/3452; F21Y 2115/10
See application file for complete search history.

(56) References Cited

U.S. PATENT DOCUMENTS

| | | |
|---|---|---|
| 2016/0247978 A1 | 8/2016 | Ishida et al. |
| 2017/0047485 A1 | 2/2017 | Scordino et al. |
| 2017/0090108 A1 | 3/2017 | Furuta et al. |
| 2017/0103966 A1 | 4/2017 | Choi et al. |

FOREIGN PATENT DOCUMENTS

| | | | | |
|---|---|---|---|---|
| DE | 102014101783 A1 | * | 8/2015 | ............... F21K 9/20 |
| JP | 2005286099 A | | 10/2005 | |
| JP | 2006332492 A | | 12/2006 | |
| JP | 2014060211 A | * | 4/2014 | ............. H01L 23/13 |

OTHER PUBLICATIONS

German Search Report based on Application No. 10 2017 209 065.0 (8 pages) dated May 17, 2019 (for purpose only).

* cited by examiner

LIGHT DEVICE, HEADLIGHT AND METHOD

CROSS-REFERENCE TO RELATED APPLICATIONS

The present application is a national stage entry according to 35 U.S.C. § 371 of PCT application No.: PCT/EP2018/062234 filed on May 11, 2018; which claims priority to German Patent Application Serial No.: 10 2017 209 065.0, which was filed on May 30, 2017; both of which are incorporated herein by reference in their entirety and for all purposes.

TECHNICAL FIELD

The invention is directed to a light device having a printed circuit board, on which a radiation source is fastened and electrically contacted using a soldered bond. Furthermore, the invention relates to a headlight and a method for producing a light device.

BACKGROUND

For many applications, an accurate alignment of a light source with respect to an optical unit connected downstream, which further processes the light, is necessary, in particular with respect to the optical main axis of the optical unit, if it is used as a projection optical unit. Efficiency losses and artifacts, for example, inhomogeneities in the color and intensity distribution, can thus be reduced.

If a module is provided with light-emitting diodes (LEDs), which includes multiple chip-shaped LEDs arranged on a printed circuit board (PCB), it is routinely necessary for the individual chip-shaped LEDs of the module to be aligned with low position tolerance respectively in relation to one another and with respect to the printed circuit board.

So-called "pick and place methods" are typically used in the prior art for positioning LEDs on a printed circuit board. In this case, the chip-shaped LEDs are picked up and placed on the printed circuit board with a comparatively high accuracy, for example, a tolerance of at most 25 µm. Such a positioning accuracy is not sufficient for many applications, however, or is reduced again by the subsequent soldering process.

In addition, there is still a further problem, which obstructs the accurate positioning of the LEDs on the printed circuit board. A printed circuit board includes an electrically conductive substrate or an electrically conductive layer, for example, a copper substrate or a copper layer, as essential components, in which conductor tracks for supplying the LEDs are formed. Furthermore, the printed circuit board can have a lacquer layer, which is deposited on the conductive substrate and is used as electrical insulation. For soldering a respective LED, the substrate may include a contacting area or copper area or copper pad, which has a similar size as the corresponding LED. The LED can then be positioned on the contact area, wherein the positioning limits are then implemented by the contacting area. Alternatively, it can be provided that the contacting area is significantly larger than the corresponding LED for thermal spreading. A displacement of the LED during the mounting is then limited in this case by the layer opening of the lacquer layer. Accordingly, a lacquer layer cannot be provided in the region in which the LEDs are placed on the printed circuit board and are to be contacted with the substrate. To prevent contacting problems from occurring, this lacquer-free zone has to be larger by at least the order of magnitude of the lacquer tolerances than the size of the chip-shaped LED. For example, a chip-shaped LED having a cross-sectional area of 1 m×1 mm typically requires a lacquer-free zone of at least the size of 1.05 m×1.05 mm. In particular if the contacting area cannot be used as a spatially limiting element because of the thermal spreading below the LED, because its surface extension has to significantly exceed the size of the chip-shaped LED, only the lacquer layer can be used as the spatial delimitation of the chip-shaped LED, which floats during the soldering.

A solder is typically used for the electrical contacting and fixing of the chip-shaped LEDs on the printed circuit board. This solder is heated enough that it melts and forms a type of solder cushion, on which the chip-shaped LED floats after the placement, until the solder has solidified again after a corresponding cooling procedure.

Attempts have heretofore been made to enhance the positioning accuracy of the LEDs on the printed circuit board by way of the smallest possible layer openings of the lacquer layer and/or the smallest possible quantities of solder. Both approaches are limited in the possibilities thereof, however, since the risk of a poor electrical and thermal connection of the LEDs and the printed circuit board increases in that either the chip-shaped LED is partially arranged on the lacquer layer or the solder quantity is excessively small. In applications having individual LEDs, a subsequent adjustment of the module and/or the associated optical unit somewhat in relation to one another could provide a remedy, but this is complex and costly. Moreover, this is hardly still possible in the case of applications as in the field of effect lighting, in which modules can have several tens of LEDs up to more than 100 LEDs. In this case, the deviations between the LEDs then can no longer be compensated for later.

SUMMARY

In contrast, the invention is based on the object of providing a light device and a headlight, which are designed simply and cost-effectively with respect to the device and have a high efficiency and/or fewer interfering artifacts. Furthermore, it is the object of the invention to provide a method for producing a light device, which is cost-effective and results in a light device having a high efficiency.

The object is achieved with respect to the light device according to the features of claim 1, with respect to the headlight according to the features of claim 14, and with respect to the method according to the features of claim 15.

Particularly advantageous embodiments are found in the dependent claims.

According to a non-limiting embodiment, a light device having a printed circuit board is provided, which includes an electrically conductive substrate. At least one radiation source can be fastened thereon and in particular can be electrically contacted via a soldered bond provided between the radiation source and the substrate. The radiation source is fastened in this case on a mounting area of the substrate via the soldered bond. The mounting area can be delimited in this case at least in sections by a layer arranged on the substrate, in particular an insulation layer, and/or by an edge of the substrate. At least one outlet space or outlet zone is advantageously formed for liquid solder. Liquid solder occurs during the production of the soldered bond. The at least one outlet space is then connected to the mounting area via at least one outlet opening. The at least one outlet space and/or the at least one outlet opening is/are advantageously arranged and/or formed in such a way that during the production of the soldered bond, a defined positioning of the radiation source with respect to or on the layer and/or on the edge is performed by the flowing of the liquid solder through the at least one outlet opening into the at least one outlet space.

This solution has the advantage that a solder discharge process during the production of the light device is intentionally utilized to enhance a positioning accuracy, by at least one solder outlet zone being designed in such a way that a direction results for the solder discharge process and the radiation source can accordingly be displaced and positioned in this direction. Furthermore, excess solder can drain off with the outlet space, which promotes the reduction of the solder thickness and thus reduces the thermal resistance and also the tilting of the radiation source. For example, during the discharge of the solder into the at least one outlet space, the radiation source can also move in the direction of the outlet flow, wherein this is utilized for positioning the radiation source. The light device thus results in enhanced positioning accuracy in a simple and cost-effective manner with respect to the device and thus in improved efficiency in an application, as well as a reduction of interfering artifacts.

The layer may advantageously include at least one layer opening for the at least one radiation source, wherein the radiation source can be arranged on the substrate via the layer opening.

Alternatively or additionally to the layer, the substrate, as already mentioned above, can have an edge which encloses the substrate. The substrate can then be arranged like an island or peninsula on the printed circuit board and can be enclosed by the edge completely or at least in sections. For example, it is also conceivable that a plurality of substrates is provided, wherein the island-like substrates are connected to one another, for example, via webs, and thus form a common edge.

It is also conceivable to provide multiple radiation sources, wherein then a respective mounting area or layer opening can be provided for a respective radiation source of at least a part of the radiation sources or all radiation sources. If multiple mounting areas or layer openings are provided, the embodiment explained above and hereafter is thus to be provided for a respective mounting area or layer opening, thus also with respect to outlet space and outlet opening, of at least a part of the mounting areas or layer openings or all mounting areas or layer openings. The radiation source is embodied as a light-emitting diode (LED).

The layer which is arranged on the substrate is an insulation layer. This layer is applied as a lacquer, for example.

The layer advantageously has a layer border, which delimits the layer opening and which has a support surface or contact surface for the radiation source in order to position it. Therefore, the radiation source not only can be moved in a defined manner by way of the arrangement and embodiment of the at least one outlet space and the at least one outlet opening, but rather also can be supported in a defined manner on the layer border to assume an accurate position. The support takes place in this case, for example, indirectly via the solder or immediately and directly.

If the substrate is delimited by the edge, the radiation source can thus be supported on the edge. This is achieved by the wettability of the solder, which cannot flow over the edge. The radiation source can thus be supported on the edge of the substrate similarly as with the above-mentioned layer border.

In a further embodiment, the layer border may include two support surfaces or the edge may include two support regions. These can be arranged in such a way that a centering of the radiation source is thus enabled during the production of the soldered bond. The radiation source can then be positioned in a defined manner in both spatial directions in its displacement plane, which can extend in parallel to the substrate. The displacement of the radiation source is sufficiently large that it reaches the layer border or the periphery of the lacquer-free zone or the edge and is only stopped by the barrier provided here, namely the layer or the edge. The positioning accuracy can thus be improved to nearly the single lacquer tolerance.

In the non-soldered state, the radiation source is movable freely on the mounting area, i.e., in all directions approximately in parallel to the substrate.

In a further embodiment, the at least one outlet space is formed in the layer in a simple manner with respect to the device. It would also be conceivable that the outlet space is provided in the substrate or at another point of the printed circuit board. For example, it would also be conceivable that the outlet opening is also formed by an aperture or bore or passage bore through the printed circuit board, wherein then the outlet space can be provided on a side of the printed circuit board facing away from the radiation source.

If the substrate is delimited by the edge, it can thus be provided that the outlet space forms a part of the substrate and can thus be delimited and formed by a surface of a substrate section. The substrate section can be connected to a substrate section including the mounting area via a geometrical bottleneck of the substrate. This bottleneck can then form the outlet opening between the mounting area and the outlet space.

Furthermore, it can be provided that the outlet opening is introduced in a simple manner with respect to the device into the layer edge. In this way, it can be designed and formed simply.

At least two outlet openings are provided, which are arranged in such a way that a displacement force is applied in two directions to the radiation source by the solder flowing in the outlet openings. In this way, the radiation source can be moved in a corner region of the layer opening or mounting area during the production of the soldered bond. The outlet zones can thus be arranged in such a way that the radiation source can be moved in two directions and finally can come to a standstill in a corner of the lacquer-free zone or mounting area. In this manner, the best possible positioning accuracy is achieved.

In one embodiment, a plurality of outlet openings, which are each connected to the layer opening or mounting area, is provided. They are then distributed asymmetrically in the circumferential direction of the layer opening or mounting area and/or have different opening cross sections. In this way, a displacement force, which then acts on the radiation source, can be formed in a defined manner via a respective outlet opening. A defined positioning movement of the radiation source is thus enabled. In contrast, if a symmetrical arrangement of the outlet openings were provided on the sides of the layer opening or mounting area, which are each of equal size, this could have the result that the main direction of the flowing solder is erratic, so that the radiation source is moved in different directions, which could result in undefined positioning of the radiation source. The radiation source would then not be moved to a desired position, but rather would be laterally displaced and/or pivoted in an undefined manner. This is advantageously avoided by the asymmetrical arrangement of the outlet openings.

In the further embodiment, a plurality of outlet spaces can be provided, which are connected via a respective outlet opening to the layer opening or mounting area. The outlet openings can then be distributed asymmetrically in the circumferential direction of the layer opening or mounting area and/or can have different sizes to set the flow properties in the flow direction of the solder in a defined manner to then be able to displace and position the radiation source in a defined manner accordingly.

The layer opening or mounting area or the substrate has, for example, a rectangular or n-polygonal cross section, in particular approximately. In this way, for example, one support surface or two support surfaces or one support region or two support regions can be formed in a simple manner. Two adjacent border sections of the layer border or the edge angled in relation to one another are then formed as support surfaces or support regions, which results in simple centering of the radiation source. It is also conceivable to provide a different cross section, for example, a round cross section, since a defined positioning would also be possible here.

The radiation source has a housing having a rectangular cross section, in particular approximately. This results in simpler centering of the radiation source. Of course, another shape is also conceivable, for example, a round shape, and is suitable for defined positioning.

One outlet opening, in particular one single outlet opening, is advantageously provided in the corner region of the polygonal, in particular quadrilateral layer opening or mounting area. An asymmetrical solder flow can thus be provided in a simple manner, which results in defined positioning of the radiation source. The border sections of the layer border or the edge adjacent to the corner region are then provided as support areas or support regions. The radiation source can then be moved by flowing of the solder into the corner region and can be supported in a defined manner on the layer border or the edge. Alternatively it is conceivable to provide the, in particular single, outlet opening in a border section of the polygonal, in particular quadrilateral layer opening or mounting area. The defined positioning can then take place on the border section or on other border sections, in particular two thereof. The radiation source is then accurately positioned at least with respect to one direction.

In a further embodiment, two outlet openings are provided, in particular precisely or at least two, which are each introduced into a respective border section of the layer border of the polygonal, in particular quadrilateral layer opening or which each extend from a respective border section of the edge of the polygonal, in particular quadrilateral substrate. The border sections are adjacent in this case. The respective outlet opening is connected to a respective outlet space. A displacement force can then be applied to the radiation source in two directions by flowing of the solder via the two outlet openings and said radiation source can be moved and positioned in the corner region between the two border sections. The outlet openings are formed in the middle of the border sections or offset in relation to the middle. If the outlet openings are arranged off-center, they are thus arranged approaching one another and/or toward the corner region. It is also conceivable that two or at least two outlet openings are provided in the case of a shape of the layer opening or the edge deviating from the polygonal shape.

In a further embodiment, three or four border sections of the layer border of the polygonal, in particular quadrilateral layer openings or the edge of the polygonal, in particular quadrilateral substrate may each include an outlet opening. The respective outlet opening is connected to a respective outlet space. Two adjacent outlet openings have a larger cross section in this case than the further or the respective further outlet openings. An elevated flow speed of the solder and an elevated flow rate quantity of the solder are achieved by the larger cross section, whereby the displacement forces acting on the radiation source for positioning the radiation source are elevated. The force or forces resulting due to the smaller outlet openings or due to the smaller outlet opening can be used for stabilizing the radiation source, for example, to prevent tipping of the radiation source. Moreover, a larger quantity of solder can drain off through the additional outlet openings, whereby a solder thickness can advantageously be reduced if needed overall. Two adjacent outlet spaces have a larger cross section than the further outlet space or the respective further outlet spaces in this embodiment. Therefore, more solder can flow into these larger outlet spaces and a displacement force can thus be applied longer to the radiation source in this direction, which finally results in the desired positioning of the radiation source. Since three or four outlet spaces are provided, a large quantity of solder can nonetheless be discharged. It is also conceivable that the outlet openings are provided in the case of a shape of the layer opening or edge deviating from the polygonal shape.

The outlet space or at least one outlet space or at least a part of the outlet spaces or all outlet spaces in relation to which the radiation source is moved in a defined manner can be widened in a direction away from the layer opening or from the mounting area. Due to this widening, the flow resistance is less after the outlet opening than in the outlet opening. It is also conceivable that the outlet space or the outlet spaces toward which the radiation source is moved in a defined manner taper in a direction away from the layer opening or the mounting area. A space-saving design of the outlet space or the outlet spaces can be formed in this way.

The solder for the soldered bond has a comparatively low viscosity, which improves flowing of the solder into the outlet space or the outlet spaces. The solder has viscosity-reducing additives for this purpose, which can be admixed to the solder.

In a further embodiment, it can be provided that at least a part of the surface which is wetted by the solder or over which the solder flows is comparatively smooth. However, a flow speed of the solder can be elevated, which is advantageous for the displacement of the radiation source. Furthermore, it can be provided that the surface, in particular the substrate, which is wetted by the solder or over which the solder flows, is coated at least in sections using a material which results in an enhancement of the wettability. In particular, it can be provided that the surface in one outlet space or multiple or all outlet spaces is coated at least in sections using the material.

The substrate is formed from copper, which results in a high electrical conductivity. A layer can additionally be applied or introduced or formed, for example, on the substrate at least on sides of the radiation source. This layer is, for example, a tin-containing and/or silver-containing and/or gold-containing layer and/or an ENEPIG layer (electroless nickel electroless palladium immersion gold layer).

The radiation source is soldered, for example, with a contacting field or copper pad of the substrate. This can be larger or equal in size to the layer opening or the mounting area. The layer opening is arranged completely above the contacting field or encloses the contacting field in this case. This results in secure contacting of the radiation source.

The light device is part of a headlight. It can be used in particular for effect lighting because high efficiencies are required in this field.

Alternatively, it is conceivable to use the headlight or the light device for entertainment lights, architainment lights, general lights, medical and therapeutic lights, lights for landscaping, or for lights in automotive technology.

A light-emitting diode (LED) can be provided in the form of at least one individually housed LED or in the form of at least one LED chip, which includes one or more light-emitting diodes. Multiple LED chips can be mounted on a common substrate ("submount") and can form one LED or can be individually or jointly fastened, for example, on a printed circuit board (e.g., FR4, metal core printed circuit board, etc.) ("CoB"=Chip on Board). The at least one LED can be equipped with at least one separate and/or common optical unit for beam guiding, for example, with at least one Fresnel lens or a collimator. Alternatively or additionally to inorganic LEDs, for example, based on AlInGaN or InGaN or AlInGaP, in general organic LEDs (OLEDs, for example, polymer OLEDs) are also usable. The LED chips can be directly emitting or may include an upstream phosphor. Alternatively, the light-emitting component can be a laser diode or a laser diode arrangement. Providing an OLED luminescent layer or multiple OLED luminescent layers or an OLED luminescent region is also conceivable. The emission wavelengths of the light-emitting components can be in the ultraviolet, visible, or infrared spectral range. The light-emitting components can additionally be equipped with a separate converter. The LED chips emit white light in the normed ECE white area of the automotive industry, for example, implemented by a blue emitter and a yellow/green converter.

The term "approximately" can indicate, for example, that a deviation can be present in the technically-routine tolerances or of up to 5%.

A method is provided for producing a light device according to one or more of the preceding aspects, which may include the following steps:
- arranging the radiation source on the solder in the layer opening or on the mounting area of the substrate,
- heating and melting the solder, and
- flowing of the liquid solder via the at least one outlet opening into the at least one outlet space, wherein the radiation source is also moved and positioned in a defined manner.

In the solid state, the solder is formed as a solder paste or as a solder cushion or as a solder depot.

To melt the solder, the temperature is raised beyond the melting temperature, which is dependent on the solder used. The melting of the solder then takes place quasi-homogeneously in all of the solder because of the comparatively small dimensions, whereby a nearly instantaneous solid-liquid transition is achieved.

The melting or fusing of the solder takes place using a process in which thermal energy is introducible into the solder. In particular, a furnace is provided for this purpose.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the illumination apparatus. In the following description, various aspects are described with reference to the following drawings, in which.

DETAILED DESCRIPTION

Figure 1:
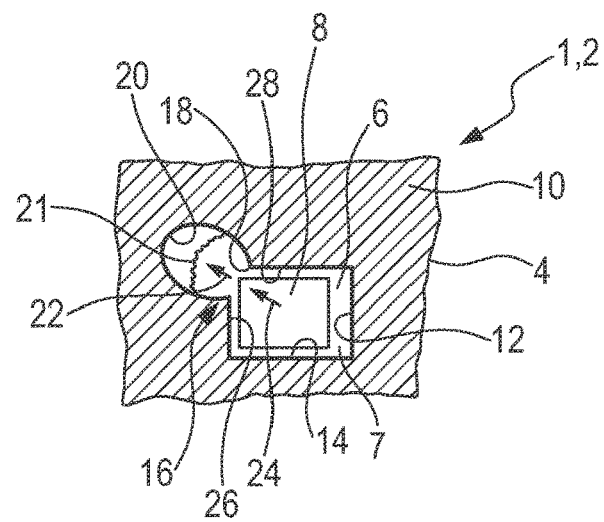
FIGS. 1 to 3 each show a top view of a detail of a light device according to a respective exemplary embodiment, FIGS. 4a and 4b each show a top view of a detail of a light device according to a further exemplary embodiment, wherein different method steps of a method for producing the light device are apparent.

A light device 1, which is part of a headlight 2, is illustrated according to FIG. 1. This light device has a printed circuit board 4, of which a detail is shown according to FIG. 1, having a substrate 6, which forms a layer of the printed circuit board 4. The substrate 6 is used for the electrical contacting of a radiation source in the form of a light-emitting diode (LED) 8. The chip-type LED 8 is soldered to the substrate 6 for this purpose on a mounting area 7 of the substrate 6. A layer in the form of a lacquer insulation layer 10 is applied to the substrate 6. This layer has a layer opening 12, which has a larger cross section than the LED 8, wherein the LED 8 is freely movable in the layer opening 12 in the non-soldered state. The layer opening 12 results in accessibility to the substrate 6, so that the LED 8 can be soldered to the substrate 6. Both the LED 8 and also the layer opening 12 have a rectangular cross section, in particular approximately. The layer opening 12 thus has a quadrilateral layer border 14. An outlet opening 18 is introduced into a corner region 16 of the layer border 14. An outlet space 20, which is formed in the insulation layer 10, is connected to the layer opening 12 via this opening.

During the production of the light device 1, the LED 8 is arranged on a solid solder 21. After the melting of the solder, it then flows via the outlet opening 18 into the outlet space 20, whereby a flow direction 22 is achieved. The LED 8 is moved in a movement direction 24 by the flowing solder 21, which approximately corresponds to the flow direction 22 and points into the corner region. The LED 8 is thus drawn by the solder 21 into the corner region 16. A displacement movement of the LED 8 is then limited by the layer border 14. This border forms two support surfaces 26, 28 extending away from the outlet opening 18 in this case, at which the cuboid LED 8 is supported and centered in a defined manner. The support takes place in this case directly or via the solder 21 between the support surfaces 26, 28 and the LED 8.

According to FIG. 1, a lacquer-free zone in the form of the layer opening 12 is thus provided, which is connected to an asymmetrically arranged lacquer-free outlet space 20. A solder flow can thus take place in a defined direction and the LED 8 can be moved up to the borders of the lacquer-free zone.

Figure 2:
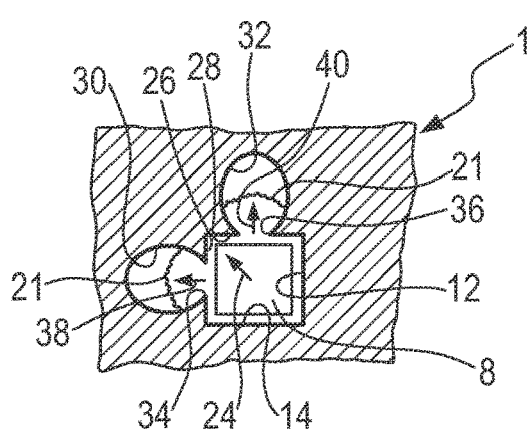

According to FIG. 2, two outlet spaces 30, 32 are provided in contrast to FIG. 1. These are each connected via an outlet opening 34, 36 to the layer opening 12. A respective outlet opening 34, 36 is introduced in this case into a respective support surface 26, 28 of the layer border 14. The support surfaces 26, 28 are angled in this case, in particular perpendicularly in relation to one another.

During the production of the light device 1 according to FIG. 2, solder 21 flows into a respective outlet space 30 and 32. The solder 21 which flows into the outlet space 30 has a first movement direction 38 and the solder 21 which flows into the second outlet space 32 has a movement direction 40. The movement direction 24 of the LED 8 is then vectorially composed of the two movement directions 38 and 40, which are arranged approximately perpendicularly in relation to one another. The LED 8 is thus also moved according to FIG. 2 into a corner region until the LED 8 is supported on the support surfaces 26 and 28.

Figure 3:
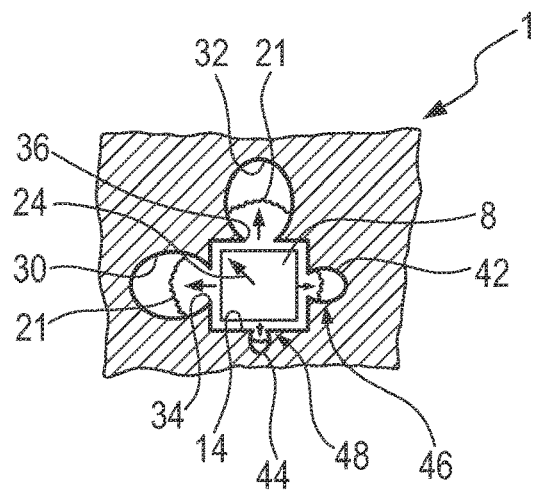

FIG. 3 shows the light device 1, in which in contrast to the preceding embodiments, four outlet spaces 30, 32, 42, and 44 are provided. A respective outlet space 30, 32, 42, and 44 is introduced in this case into a respective layer side of the layer border 14. The formation and arrangement of the outlet spaces 30 and 32 with the outlet openings 34, 36 thereof corresponds in this case to that from FIG. 2. The outlet space 42, in contrast, is formed smaller than the outlet spaces 30 and 32. It is opposite to the outlet space 30 in this case. Its outlet opening 46 is also smaller than the outlet openings 34, 36. The outlet space 44, which is arranged opposite to the outlet space 32, is even smaller than outlet space 42, which is already smaller. Furthermore, its outlet opening 48 is also smaller than the outlet opening 46. The maximum quantity of solder which can be introduced therein can be set by the size of the outlet spaces 30, 32, 42, and 44. Furthermore, a solder quantity flow is settable by the size of the outlet openings 34, 36, 46, and 48. Due to the larger outlet openings 34 and 36 and the larger outlet spaces 30 and 32, more solder 21 thus flows in a shorter time into the outlet spaces 30 and 32 in comparison to the outlet spaces 42 and 44. The LED 8 is thus moved in the movement direction 24, although forces counteract this which are formed by flowing of solder into the outlet spaces 42 and 44. These forces are less than the forces acting on the LED 8 due to the flowing of the solder 21 into the outlet spaces 30 and 32, however. The smaller forces are used to stabilize the movement of the LED 8. Furthermore, the additional outlet spaces 42 and 44 result in more uniform drainage of the solder out of the layer opening 14. Furthermore, the quantity of the solder flowing away can be elevated by the plurality of outlet spaces 30, 32, 42, and 4.

Figure 4A:
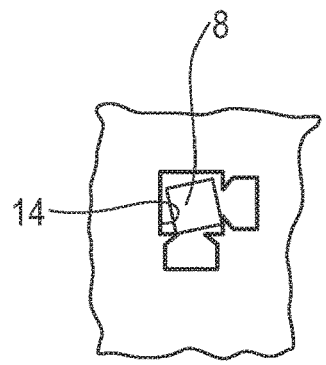
Figure 4B:
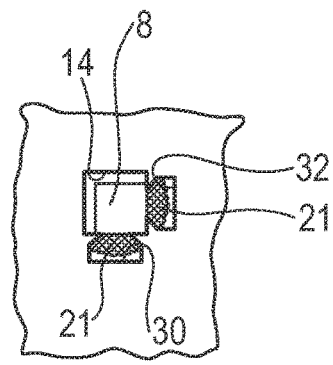

According to FIG. 4a, the LED 8 is shown in a state in which the LED 8 was placed pivoted in the substrate plane at an undesired angle of approximately 15° in relation to the layer border 14 in a pick and place process. A state is then shown in FIG. 4b, in which solder 21 has flowed into the outlet spaces 30 and 32, whereby overall the LED 8 is moved into the corner region and after automatic centering via the targeted movement is supported on the layer border 14 against the two support surfaces adjoining the outlet spaces 30 and 32. In this way, the LED 8 is now aligned as desired in parallel to the support surfaces. The LED 8 was thus rotated by the above-mentioned angle of approximately 15°.

Figure 5:
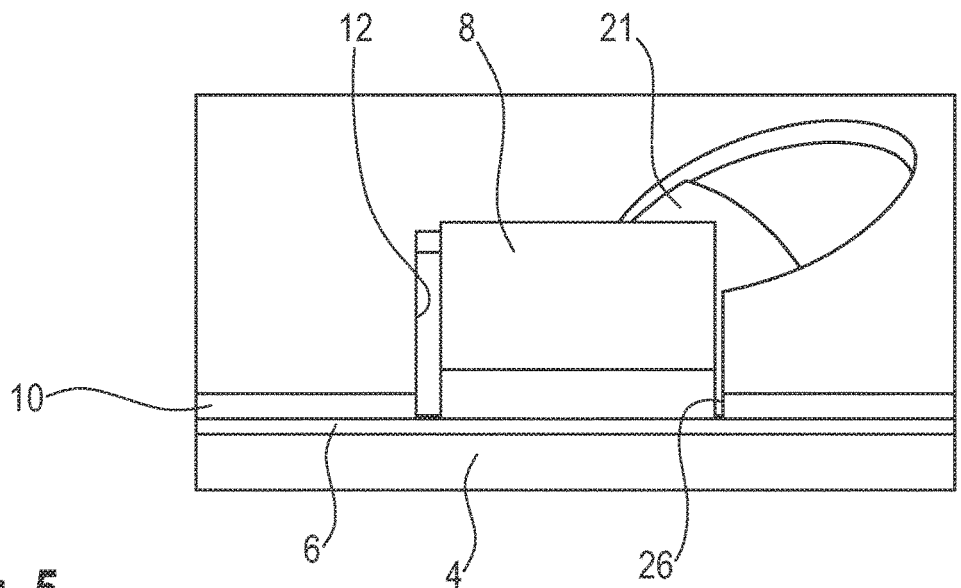
FIG. 5 shows the light device from FIG. 1 in a perspective longitudinal section.

FIG. 5 shows a perspective longitudinal section in simplified form of a detail of the light device 1 from FIG. 1. As explained above, the substrate 6 is arranged on the printed circuit board 4. The layer 10 having the layer opening 12 is provided thereon. The LED 8 is fastened on the substrate 6 using the solder 21 via the layer opening 12. In FIG. 5, the support surface 26 is shown as a surface formed approximately perpendicularly in relation to the substrate 6. It is also conceivable that the support surface is formed in a curved manner i.e., for example, as a surface which extends in a curve proceeding from the substrate 6 in a direction away from the LED 8. For the positioning, the LED 8 is supported via the solder 21 or directly on the support surface 26.

Figure 6:
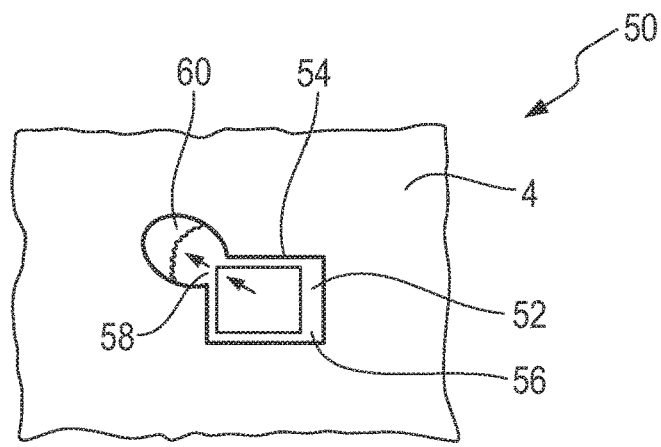
FIG. 6 shows a top view of a detail of a light device according to a further exemplary embodiment.

A further light device 50 is shown in FIG. 6. In contrast to the above-explained embodiments, a lacquer layer is not provided in this case. Instead, a substrate 52 having an edge 54 is fixed on the printed circuit board 4. The substrate 52 is formed like an island in this case, wherein the edge 54 is then formed completely circumferentially. The substrate 52 has a mounting area 56 on which the LED 8 is arranged via a solder, wherein the mounting area 56 is delimited by the edge 54. An outlet opening 58, which is connected to an outlet space 60, extends from a corner region of the quadrilateral mounting area 56. Both the outlet opening and also the outlet space 60 are part of the substrate 52 and are enclosed by the edge 54. The outlet opening 58 is formed by a geometrical constriction of the substrate between the region having the outlet space 60 and the mounting area 56. The outlet space 60 is formed by a surface section of the substrate 52. During the production, liquid solder then flows into the outlet space 60, whereby the LED 8 is moved according to FIG. 1 into the corner region of the mounting area 56 until the LED 8 is supported at the edge 54 via the solder and is no longer moved further. Alternatively, the substrate can be formed having one outlet space or multiple outlet spaces and one outlet opening or multiple outlet openings geometrically corresponding as shown in FIGS. 2 and 3.

Figure 7:
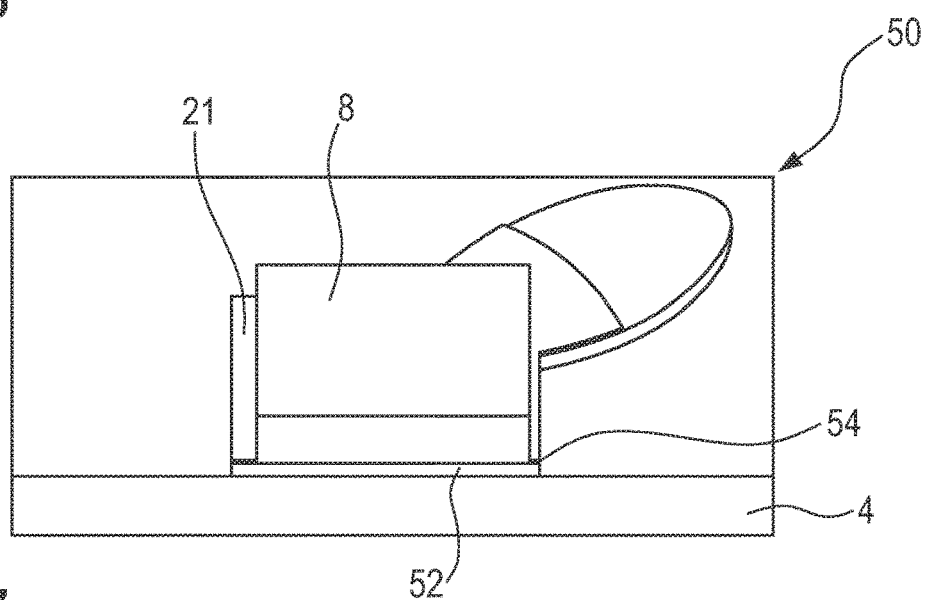
FIG. 7 shows the light device from FIG. 6 in a perspective longitudinal section.

FIG. 7 shows a perspective longitudinal section of a detail of the light device 50 from FIG. 6. The printed circuit board 4, the substrate 52, and the LED 8 are recognizable in this case, which is arranged via the solder 21 on the substrate 52. The solder 21 cannot flow over the edge 54 in this case, because of which the LED 8 can be supported on the edge 54 via the solder 21 and can assume a defined position.

A light device having a printed circuit board is disclosed. The circuit board has one or more conductive sections. A light-emitting diode (LED) is electrically contacted and fastened on a conductive section via a soldered bond. Furthermore, the printed circuit board includes a lacquer insulation layer and/or the conductive section has an edge. The fastening region of the LED is connected via an outlet opening to an outlet space so that molten solder can drain off in a defined manner during the production. The arrangement and/or formation of the outlet opening take place for this purpose in such a way that a movement direction of the LED is formed to position it in a defined manner.

LIST OF REFERENCE SIGNS light device 1; 50
headlight 2
printed circuit board 4
substrate 6; 52
mounting area 7; 56
LED 8
insulation layer 10
layer opening 12
layer border 14
corner region 16
outlet opening 18; 34, 36; 46, 48; 58
solder 21
outlet space 20; 30, 32; 42, 44; 60
flow direction 22
movement direction 24; 38, 40
support surface 26, 28
edge 54

The invention claimed is:
1. A light device having a printed circuit board, wherein the printed circuit board comprises:
an electrically conductive substrate having a mounting area;

at least one radiation source fastened to the mounting area via a soldered bond provided between the at least one radiation source and the mounting area, wherein the mounting area is fully delimited by a layer arranged on the substrate and/or by an edge of the electrically conductive substrate; wherein the at least one radiation source is fully arranged within the mounting area;

at least one outlet space for a liquid solder; wherein the at least one outlet space is connected to the mounting area via at least one outlet opening, wherein the at least one outlet opening and/or the at least one outlet space is/are arranged and/or formed in such a way that during the production of the soldered bond, a defined positioning of the radiation source with respect to the layer and/or with respect to the edge takes place due to the flowing of the liquid solder through the at least one outlet opening in the at least one outlet space.

2. The light device as claimed in claim 1, wherein the at least one outlet space and/or the at least one outlet opening is/are delimited by the electrically conductive substrate.

3. The light device as claimed in claim 1, wherein the layer has at least one layer opening for the at least one radiation source, via which the at least one radiation source is arranged on the electrically conductive substrate.

4. The light device as claimed in claim 3, wherein the layer comprises a layer border, which delimits the layer opening and forms a support surface for the at least one radiation source, in order to position the at least one radiation source.

5. The light device as claimed in claim 4, wherein the layer border comprises two support surfaces for centering the radiation source during the production of the soldered bond.

6. The light device as claimed in claim 1, wherein the at least one outlet space is arranged in the layer.

7. The light device as claimed in claim 4, wherein the at least one outlet opening is introduced into the layer border.

8. The light device as claimed in claim 1, wherein the at least one outlet opening comprises at least two outlet openings arranged in such a way that a displacement force is applied to the at least one radiation source in two directions; and wherein the at least one radiation source is arranged into a corner region of the mounting area.

9. The light device as claimed in claim 1, wherein the at least one outlet opening comprises a plurality of outlet openings and each connected to the mounting area, wherein the plurality of outlet openings are distributed asymmetrically in the circumferential direction of the mounting area and/or wherein the plurality of outlet openings have a different opening cross section.

10. The light device as claimed in claim 1, wherein the at least one outlet space comprises a plurality of outlet spaces connected via a respective outlet opening to the mounting area, wherein the plurality of outlet spaces are distributed asymmetrically in the circumferential direction of the mounting area and/or the plurality of outlet spaces have different sizes.

11. The light device as claimed in claim 1, wherein the mounting area has a polygonal cross section and/or wherein the at least one radiation source has a housing with a polygonal cross section.

12. The light device as claimed in claim 11, wherein the at least one outlet opening is arranged in the corner region of the polygonal cross section of the mounting area.

13. The light device as claimed in claim 11, wherein the at least one outlet opening comprises two outlet openings, which are each arranged into a respective border section of the polygonal cross section of the mounting area, wherein the border sections are adjacent to each other.

14. A headlight having a light device as claimed in claim 1.

15. A method for producing a light device as claimed in claim 1, wherein the method comprises:
arranging the at least one radiation source on the solid or non-liquid solder on the mounting area;
heating and melting the solder, wherein the at least one radiation source is configured as a floating arrangement; and
flowing the liquid solder via the at least one outlet opening into the at least one outlet space, wherein the at least one radiation source is also moved and positioned in a defined manner.

16. A method for producing a light device, wherein the method comprises:
providing a printed circuit board, which comprises an electrically conductive substrate, which has a mounting area, wherein the mounting area is fully delimited by a layer arranged on the substrate and/or by an edge of the substrate, wherein at least one initially solder-free outlet space is formed for a liquid solder, which is provided during the production of a soldered bond between a radiation source and the mounting area wherein the at least one outlet space is connected to the mounting area via at least one outlet opening;
applying a solder to the mounting area;
arranging the radiation source on the solid or at least non-liquid solder on the mounting area; wherein the radiation source is fully arranged within the mounting area;
heating and melting the solder, whereby a floating arrangement of the radiation source is achieved;
flowing of the liquid solder via the at least one outlet opening into the at least one previously solder-free outlet space; wherein the radiation source is also moved with the flowing solder;
stopping the movement of the radiation source by way of a border of the layer or an edge of the substrate and thus the radiation source reaches its final position.

17. The method as claimed in claim 16, wherein the at least one outlet space is arranged with respect to the mounting area in such a way that the direction resulting for the solder flow points toward the provided final position of the radiation source.

18. The method as claimed in claim 16, wherein the radiation source has a polygonal footprint and the radiation source is moved by the solder flow into a corner region of the mounting area provided for the final position of the radiation source and is aligned there along the section of the border of the layer delimiting the corner region and/or by an edge of the substrate.

19. The method as claimed in claim 18, wherein an outlet opening having an adjoining outlet space is provided in the corner region of the mounting area provided for the final position of the radiation source.

20. The method as claimed in claim 18, wherein two outlet openings each having an adjoining outlet space are provided, wherein in each case one outlet opening is introduced along one of the two adjacent sections of the border of the polygonal mounting area forming this corner region.

* * * * *